United States Patent [19]

Chi

[11] Patent Number: 5,208,181
[45] Date of Patent: May 4, 1993

[54] LOCOS ISOLATION SCHEME FOR SMALL GEOMETRY OR HIGH VOLTAGE CIRCUIT

[75] Inventor: Keh-Fei C. Chi, Singapore, Singapore

[73] Assignee: Chartered Semiconductor Manufacturing PTE Ltd., Singapore, Singapore

[21] Appl. No.: 930,367

[22] Filed: Aug. 17, 1992

[51] Int. Cl.$^5$ .............................................. H01L 21/76
[52] U.S. Cl. ........................................ 437/70; 437/924
[58] Field of Search ................................. 437/70, 924; 148/DIG. 85, DIG. 86, DIG. 117

[56] References Cited

U.S. PATENT DOCUMENTS

| 4,372,033 | 2/1983 | Chiao | 437/70 |
| 4,829,019 | 5/1989 | Mitchell et al. | 437/69 |

FOREIGN PATENT DOCUMENTS

| 146895 | 7/1985 | European Pat. Off. |
| 54-012685 | 1/1979 | Japan |
| 54-54576 | 4/1979 | Japan |
| 54-121684 | 9/1979 | Japan |
| 55-29106 | 3/1980 | Japan |
| 56-137650 | 10/1981 | Japan |
| 57-39551 | 3/1982 | Japan |
| 59-51573 | 3/1984 | Japan |
| 62-117340 | 5/1987 | Japan |

*Primary Examiner*—George Fourson
*Attorney, Agent, or Firm*—George O. Saile

[57] ABSTRACT

A process and for fabricating field oxide isolation pattern with field implants associated therewith that can be used for increasingly smaller dimensional elements, for example in feature sizes of 0.8 micrometers or less, and simpler processing than the prior art is described. A semiconductor substrate is provided. A multilayer oxidation masking structure of a thin silicon oxide layer, a silicon nitride layer, and a polycrystalline silicon layer is formed. The multilayer oxidation mask is patterned by removing the silicon nitride layer and the polycrystalline silicon layer from the areas designated to have field oxide isolation grown therein to form a narrow opening. The structure is exposed to an oxidizing environment such that the polysilicon oxide layer forms an "overhang" over part of the field isolation region. Ion implanting in a vertical direction is accomplished to form the field implant in the silicon surface of the dimension of the narrow opening less the overhang. The polysilicon oxide layer is removed. The field oxide insulator structure is grown by subjecting the structure to oxidation whereby the field implant is confined under the field oxide isolation and not encroaching the planned source/drain implant regions.

22 Claims, 2 Drawing Sheets

LOCOS ISOLATION SCHEME FOR SMALL GEOMETRY OR HIGH VOLTAGE CIRCUIT

BACKGROUND OF THE INVENTION (1) Field of the Invention

The invention relates to the manufacture of highly dense integrated circuits and more particularly to the formation of a field oxide implant within the integrated circuit.

(2) Description of the Prior Art

In the manufacture of highly dense integrated circuits, individual device structures are typically separated and electrically isolated by means of a field oxide isolation region. Prior to formation of the field oxide, field implants are formed on the substrate by ion implantation. The field oxide and field implant form part of a parasitic transistor, which should have as high a threshold voltage as possible in order to isolate the active regions.

As the size of semiconductor devices decrease, however, there have been increasing problems. In semiconductor devices, particularly MOS field effect transistor devices, there has become a problem in controlling transistor characteristics as the feature size of these devices go below one micrometer. One of the problems has been overlap between field implant and source/drain implants, or channel stop implant encroachment. This overlap is caused by the process of manufacture which includes opening the desired pattern of oxidation mask to the regions in which field oxide isolation is to be formed, ion implantation of the field implant therethrough and then oxidation to form the field oxide isolation. The field implant will deeply diffuse into the semiconductor substrate during the oxidation of the silicon surface for field isolation. During this oxidation, the dopant will encroach into the MOS field effect transistor channel regions. This encroachment will then raise the threshold voltage of the narrow channel device, making the device less useful and control more difficult, while at the same time reducing the source/drain junction breakdown voltage.

Workers in the field have understood these problems and have attempted to overcome them.

JA Application 57-39551 (Mar. 4, 1982) describes the use of a resist film smaller than the width of the hole of nitrided Si film and polycrystalline silicon film formed in pattern on a silicon oxide film on a substrate. Ions are injected through the opening and the selective oxidation is done. This is said to prevent the narrow channel effect. As semiconductor device dimensions decrease, however, dimensional control of the resist film becomes increasingly difficult.

Mitchell et al U.S. Pat. No. 4,829,019 also describes a method for overcoming channel stop encroachment. Their method includes the use of several process steps to create sidewall structures on the patterned sidewalls of the oxidation mask before the channel stop ion implantation. They also remove the sidewall structures before field oxide isolation.

It is therefore an object of this invention to provide a process for fabricating field oxide isolation pattern with field implants associated therewith that can be used for increasingly smaller dimensional elements, for example in feature sizes of 0.8 micrometers or less, and simpler processing than the prior art.

SUMMARY OF THE INVENTION

Accordingly, a method for fabricating semiconductor devices having field oxide isolation with field implant is described which is an improvement over the prior art. A semiconductor substrate is provided. A multilayer oxidation masking structure of a thin silicon oxide layer, a silicon nitride layer, and a polycrystalline silicon layer is formed. The multilayer oxidation mask is patterned by removing the silicon nitride layer and the polycrystalline silicon layer from the areas designated to have field oxide isolation grown therein to form a narrow opening. The structure is exposed to an oxidizing environment such that the polysilicon oxide layer forms an "overhang" over part of the field isolation region. Ion implanting in a vertical direction is accomplished to form the field implant in the silicon surface of the dimension of the narrow opening less the overhang. The polysilicon oxide layer is removed. The field oxide insulator structure is grown by subjecting the structure to oxidation whereby the field implant is confined under the field oxide isolation and not encroaching the planned source/drain implant regions.

Semiconductor devices such as high density VLSI MOS field effect transistor devices are formed into the regions of the structure not covered by the field oxide isolation. The remaining oxidation mask must first be removed by conventional etching techniques. Then the semiconducting devices are formed therein by conventional techniques.

DESCRIPTION OF THE PREFERRED EMBODIMENTS

Figure 1:
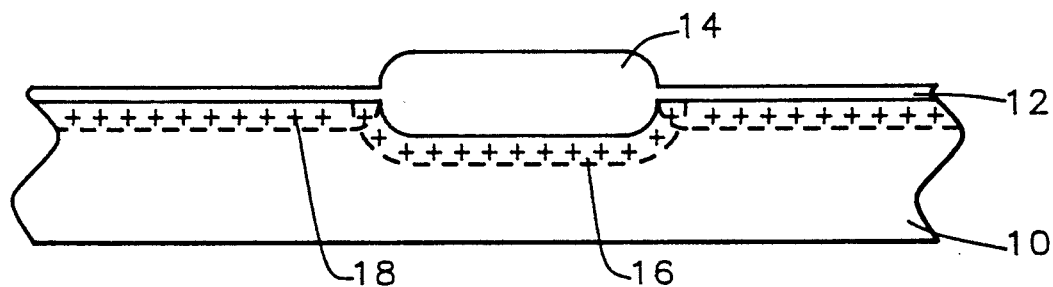
FIGS. 1 through 3 show schematic cross sectional representation of the Prior Art processes for making a field oxide isolation structure and field implant region without overlap.

Referring now to FIG. 1, there is shown a schematic diagram to demonstrate the problem found in prior art devices. As can be seen in FIG. 1, in the manufacture of FET semiconductor devices, a field oxide 14 is formed from a pad oxide 12 on a semiconductor substrate 10. The field implant 16 overlaps the source/drain implant 18, and subsequently a field implant increase will produce a lower source/drain breakdown voltage.

Figure 2:
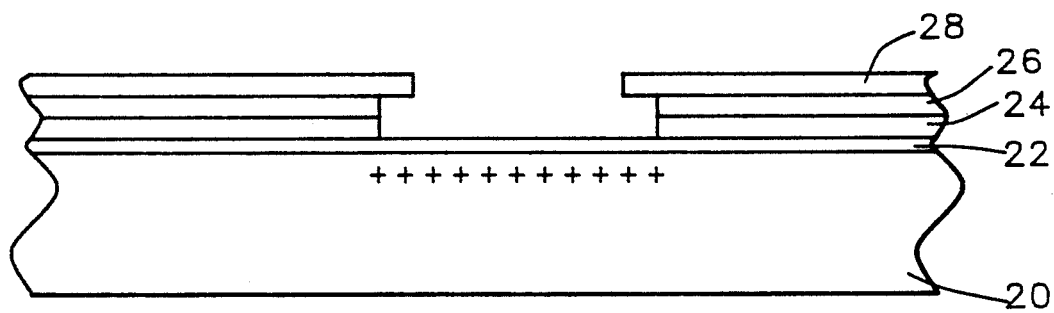

Referring now to FIG. 2, there is shown a schematic diagram to show one prior art solution to the problem of overlap of the field and source/drain implants. As can be seen in FIG. 2, a polysilicon layer 26 and nitrided Si layer 24 have been formed on a thin pad oxide layer 22 on a semiconductor substrate 20. The polysilicon and nitride layer opening has been formed larger than the photoresist 28 due to the difference of etching rates. Impurity ions are implanted through the smaller resist opening to form the field implant. However, the ability to accurately control the width of the opening formed by the photoresist 28 is limited by the resolution of optical lithography equipment, especially in the manufacture of sub-micron devices.

Figure 3:
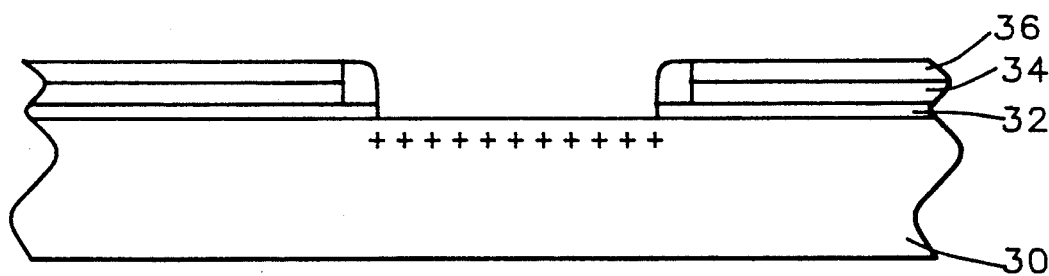

Referring now to FIG. 3, there is shown a schematic diagram to show another prior art process for solving the overlap problem between field and source/drain implants. There is shown a pad oxide layer 32, a polysilicon layer 34, a silicon nitride layer 36, and a sidewall oxide 38. The sidewall oxide is formed after patterning of layers 32, 34 and 36, conformal deposition of an insulating layer, and an anisotropic etch. Impurity ions are then implanted and the sidewall removed via another etch prior to formation of the field oxide.

Figure 4:
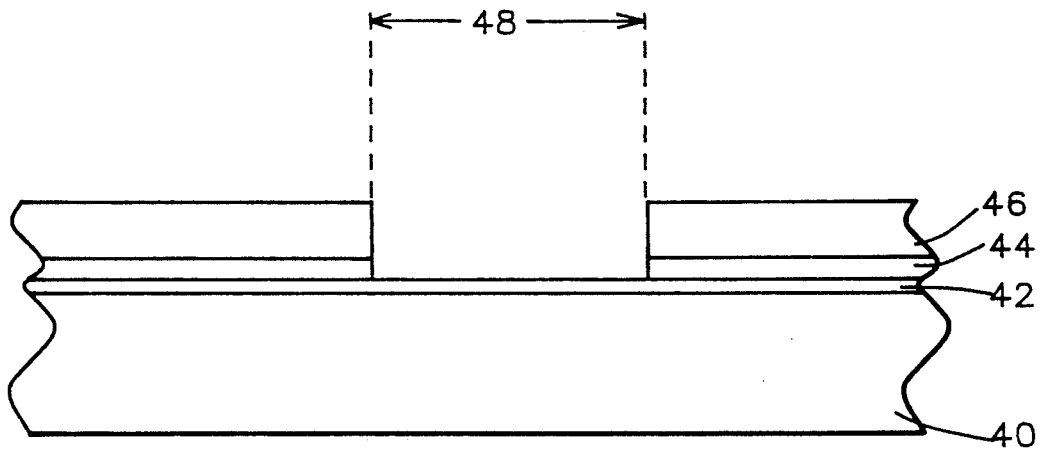
FIGS. 4 through 6 illustrate a schematic cross sectional representation of the process of the present invention for manufacturing a field oxide isolation structure and field implant region without overlap.
Figure 5:
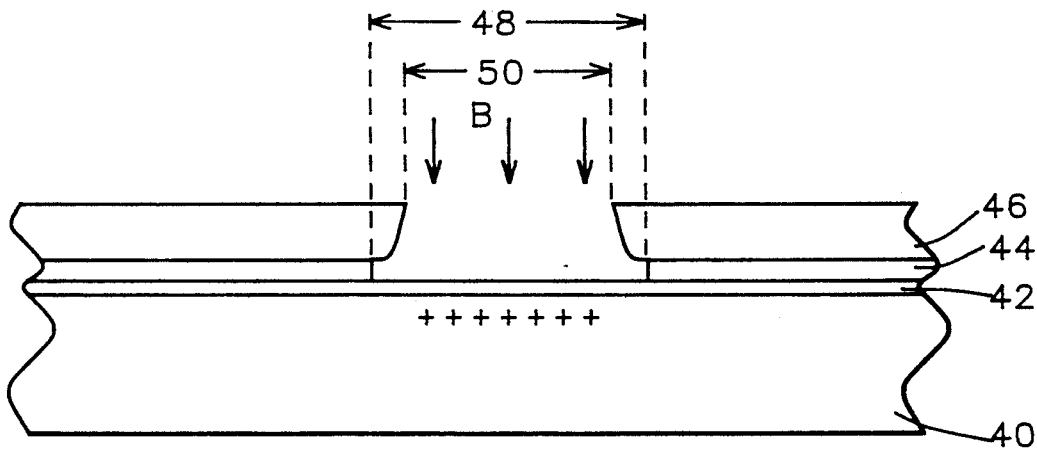
Figure 6:
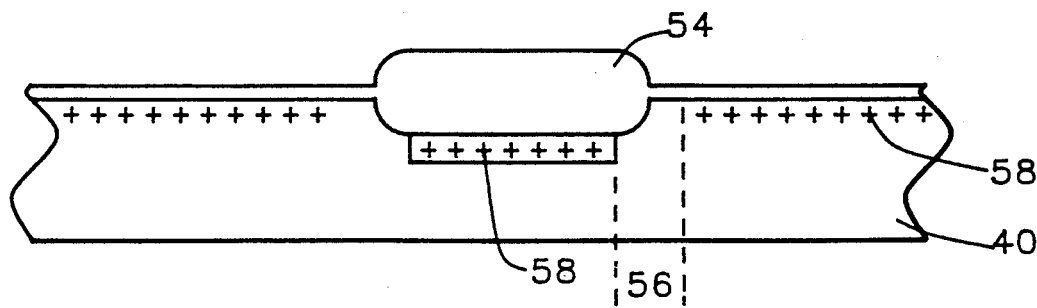

Referring now to FIGS. 4 through 6 there is shown the preferred embodiment of the present invention. A monocrystalline silicon substrate 40 is used. The multilayer oxidation mask is deposited onto the side of the substrate wherein the devices are to be formed. The multilayered oxidation mask is formed by first growing or depositing a thin silicon oxide layer 42 having a thickness between about 100 and 500 Angstroms. The layer is preferably formed by the conventional thermal growth process at a temperature of equal to or less than about 1000° C. in an oxygen atmosphere. The silicon nitride layer 44 has a thickness of between about 400 and 2000 Angstroms and is deposited by low pressure chemical vapor deposition at a temperature of equal to or less than about 780° C. The polycrystalline silicon layer 46 has a thickness of between about 1000 and 4000 Angstroms and is deposited by low pressure chemical vapor deposition at temperatures between about 550° C. and 630° C. The polysilicon layer 46 is either doped with phosphorus using $POCl_3$ as a source at a temperature of about 900° C., or in-situ doped.

The oxidation mask structure is subsequently patterned using a resist masking layer and suitable etching to define a region to be protected during field oxide formation. The lithography and etching is conventional. The preferred etching process is chlorine chemistry based. A narrow opening 48 is formed. This completes formation of the structure in FIG. 4.

Referring now to FIG. 5, the polysilicon layer 46 is oxidized by the thermal growth process at a temperature of between about 800° and 900° C. for between 10 and 120 minutes, in an oxygen and steam atmosphere, forming an overhang such that the width of the subsequent opening 50 is equal to the width of the field isolation region 48 minus the width of the overhang. This critical process can result in an overhang of preferably between about 1000 to 3000 Angstroms. The process can be accurately and easily controlled by time, temperature and ambient, as well as by the thickness of the polysilicon layer 46, to precisely control the overhang dimension. This process is of particular importance as feature sizes approach 0.6 micrometers and below.

An appropriate impurity such as Boron to create a field implant 52 is implanted into the substrate 40 in the unmasked region. The polysilicon overhang is the mask that defines the doping edge. Vertical implantation as shown by arrows is accomplished at an energy of about 50 to 80 KeV and a density of between about $1 \times 10^{13}$ to $5 \times 10^{13}$ ions/cm$^2$ in this embodiment. This completes formation of the structure in FIG. 5.

Referring now to FIG. 6, the mask structure has been removed by a conventional etching process. The field oxide isolation layer is now formed by the thermal growth process at a temperature of between about 900° and 1000° C. in an oxygen and steam atmosphere. Subsequent processing to form FET devices may take place, including implantation of source/drain implants 58 in the active regions, with gap 56 between field implant and source/drain implant. This completes formation of the structure in FIG. 6.

The result of this process is to reduce the overlap of field and source/drain implants in the FET device. For very small geometry, higher field implant is now possible without degrading the source/drain junction breakdown voltage. Or the source/drain junction breakdown voltage can be increased with the same field implant dose.

The embodiment of FIGS. 4 through 6 used a P-substrate and a P+ field implant. It should be well understood be those skilled in the art that opposite conductivities may also be used. Further, it should be understood that CMOS field effect transistors are envisioned possibly requiring field implants of either impurities of P or N under different field oxide isolation regions depending whether a P channel or N channel region is involved. Also, bipolar and BICMOS can also advantageously use this isolation process.

While the invention has been particularly shown and described with reference to the preferred embodiments thereof, it will be understood by those skilled in the art that various changes in form and details may be made without departing from the spirit and scope of the invention.

What is claimed is:

1. A method of forming a silicon oxide isolation region, with field implant, on the surface of a silicon wafer comprising:
    forming a layer of silicon oxide on the surface of said wafer;
    forming a layer of silicon nitride on said silicon oxide layer; forming a layer of polysilicon on said silicon nitride layer:
    patterning said polysilicon and silicon nitride layers to form a narrow opening over said silicon surface;
    oxidizing said polysilicon to produce polysilicon oxide overhang at the edge of said narrow opening to form a mask opening equal to said narrow opening less the overhang;
    ion implanting in a vertical direction to form said field implant in said silicon surface of the dimension of said narrow opening less said overhang;
    removing said polysilicon oxide;
    and oxidizing said isolation region to form field oxide that is larger than said field implant by said overhang dimension, and thereby not encroaching the planned device regions.

2. The method of claim 1 in which said polysilicon layer is formed updoped and subsequently doped with phosphorus using $POCl_3$.

3. The method of claim 1 in which said polysilicon layer is in-situ doped with phosphorus.

4. The method of claim 1 wherein said polysilicon is doped with an impurity greater than about $1 \times 10^{19}$ ions/cc.

5. The method of claim 1 in which the thickness of said silicon nitride layer is 400 to 2000 Angstroms.

6. The method of claim 1 in which the thickness of said polysilicon layer is 1000 to 4000 Angstroms.

7. The method of claim 1 in which said polysilicon is oxidized in a steam environment between the temperatures of 800° and 900° C.

8. The method of claim 1 in which said overhang dimension is 1000 to 3000 Angstroms.

9. The method of claim 1 in which said ion implant is a boron implant.

10. The method of claim 9 in which said boron is implanted at an energy of 50 to 80 keV.

11. The method of claim 9 in which said boron concentration is between about $1 \times 10^{13}$ and $5 \times 10^{13}$ ions/cm$^2$.

12. A method of reducing the overlap between a field implant and source/drain implants, comprising:
    forming an opening in a silicon nitride and polysilicon layered structure wherein said opening is the dimension of the planned field oxide region;
    oxidizing said polysilicon to produce a narrowed opening created by the polysilicon oxide horizontal growth into said opening;
    ion implanting a conductivity-imparting impurity in the vertical direction to form said field implant with said overhang producing a reduced field of the dimension of said narrow opening less said overhang;
    removing said polysilicon oxide;
    and oxidizing said isolation region to form field oxide that is larger than said field implant by said overhang dimension, thereby reducing said overlap between said field implant and said source/drain implants.

13. The method of claim 12 in which said polysilicon layer is formed updoped and subsequently doped with phosphorus using POCl$_3$.

14. The method of claim 12 in which said polysilicon layer is in-situ doped with phosphorus.

15. The method of claim 12 wherein said polysilicon is doped with an impurity greater than about $1 \times 10^{19}$ ions/cc.

16. The method of claim 12 in which the thickness of said silicon nitride layer is 400 to 2000 Angstroms.

17. The method of claim 12 in which the thickness of said polysilicon layer is 1000 to 4000 Angstroms.

18. The method of claim 12 in which said polysilicon is oxidized in a steam environment between the temperatures of 800° and 900° C.

19. The method of claim 12 in which said overhang dimension is 1000 to 3000 Angstroms.

20. The method of claim 12 in which said ion implant is a boron implant.

21. The method of claim 20 in which said boron is implanted at an energy of 50 to 80 keV.

22. The method of claim 21 in which said boron concentration is between about $1 \times 10^{13}$ and $5 \times 10^{13}$ ions/cm$^2$.

* * * * *